(12) United States Patent
Shibib et al.

(10) Patent No.: US 7,067,890 B2
(45) Date of Patent: Jun. 27, 2006

(54) THICK OXIDE REGION IN A SEMICONDUCTOR DEVICE

(75) Inventors: Muhammed Ayman Shibib, Wyomissing, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/953,750

(22) Filed: Sep. 29, 2004

(65) Prior Publication Data

US 2006/0071283 A1    Apr. 6, 2006

(51) Int. Cl.
*H01L 29/76* (2006.01)

(52) U.S. Cl. .............. 257/396; 257/374; 257/510; 257/647

(58) Field of Classification Search ............ 257/374, 257/396, 510, 647
See application file for complete search history.

(56) References Cited

U.S. PATENT DOCUMENTS

| 4,685,198 | A  | * | 8/1987  | Kawakita et al. ......... 438/410 |
| 6,833,583 | B1 | * | 12/2004 | Zandt et al. ............... 257/329 |
| 2005/0012175 | A1 | * | 1/2005 | Tsuruta ....................... 257/531 |
| 2005/0179112 | A1 | * | 8/2005 | Belyansky et al. ......... 257/510 |

* cited by examiner

*Primary Examiner*—Andy Huynh

(57) ABSTRACT

A method of forming an oxide region in a semiconductor device includes the steps of forming a plurality of trenches in a semiconductor layer of the device, the trenches being formed in close relative proximity to one another, and oxidizing the semiconductor layer such that an insulating layer is formed on at least sidewalls and bottom walls of the trenches. The trenches are configured such that the insulating layer formed as a result of the oxidizing step substantially fills the trenches and substantially consumes the semiconductor layer between corresponding pairs of adjacent trenches. In this manner, a substantially continuous oxide region is formed throughout the plurality of trenches.

11 Claims, 3 Drawing Sheets

THICK OXIDE REGION IN A SEMICONDUCTOR DEVICE

FIELD OF THE INVENTION

The present invention relates generally to semiconductor devices, and more particularly relates to techniques for forming an oxide region in a semiconductor device.

BACKGROUND OF THE INVENTION

Methods for forming insulating regions in a semiconductor device, often referred to as oxide regions since an oxide is most commonly used as the insulating material, are well known. These oxide regions are generally employed, for example, to provide electrical, as well as physical, isolation between metal-oxide-semiconductor (MOS) devices and device regions on a semiconductor substrate. A widely used method for providing such isolation typically includes forming regions of localized oxidation of silicon (LOCOS). A conventional LOCOS process essentially involves the growth of a recessed or semi-recessed oxide in unmasked non-active regions, often referred to as field oxide (FOX) regions, of the silicon substrate. The FOX regions are grown thick enough to reduce parasitic capacitance occurring over these regions, but not so thick as to cause step coverage problems.

A trench isolation process, such as shallow trench isolation (STI), may alternatively be used to fabricate insulating regions in a semiconductor device. The trench isolation structure typically comprises a recess formed in the silicon substrate which is refilled with a dielectric material. Such structures are fabricated by first forming a shallow trench (e.g., less than about one micrometer ($\mu m$)) in the silicon substrate, usually by a dry anisotropic etching process. The resulting trench is subsequently refilled with a dielectric material such as chemical vapor deposited (CVD) oxide. The trench is then planarized by an oxide etchback process so that the dielectric material remains only in the trench, with an upper surface of the trench being substantially level with an upper surface of the semiconductor device.

In certain applications, it may be desirable to form a thick oxide region (e.g., about 2 $\mu m$ or more) in an MOS device. For example, in order to reduce parasitic drain capacitance in the MOS device, a recessed LOCOS process may be used, in conjunction with a CVD oxide process and a partial oxide etchback process, to form a thick oxide region under a drain pad of the device. However, this methodology is undesirable in that the recessed LOCOS process often significantly increases the number of defects in the device, thereby degrading device yield and reliability. Defects resulting from the LOCOS process generally limit the practical depth of the LOCOS region to less than about 2 $\mu m$. Additionally, the partial oxide etchback process can cause topography problems, thus further degrading device reliability and performance.

Alternatively, a thick oxide region can be formed by using a recessed LOCOS process in conjunction with a multiple-level CVD oxide process and multiple-level metal process. However, as previously explained, the recessed LOCOS process often causes defects which degrade device yield and reliability. Additionally, the multiple-level CVD oxide and metal processes are complicated and suffer from electromigration problems, which can further degrade device reliability and performance.

In either case, the standard methodologies for forming a thick oxide region in an MOS device are expensive and typically involve the introduction of significant defects in the device which undesirably impact device reliability and performance. Furthermore, these conventional methodologies are generally limited to forming an oxide region having a practical depth of about 2 $\mu m$ or less.

There exists a need, therefore, for improved techniques for forming a thick insulating region in a semiconductor device that does not suffer from one or more of the above-noted deficiencies typically affecting conventional devices. Furthermore, it would be desirable if such a technique was fully compatible with standard integrated circuit (IC) process technology.

SUMMARY OF THE INVENTION

The present invention provides novel techniques for forming an oxide region, such as a thick oxide region, in a semiconductor device. By forming a plurality of trenches in a semiconductor layer of the device which are of a sufficient width and spacing, and then oxidizing the semiconductor layer, a substantially continuous oxide region can be formed without the introduction of substantial defects in the device. Therefore, the reliability and performance of the device will be significantly improved. The oxide region, when formed in accordance with the techniques of the present invention, essentially does not exhibit an inherent thickness limitation found in conventional approaches. Moreover, the techniques of the present invention can be used in an IC to fabricate at least portions of semiconductor structures including, but not limited to, monolithic inductors, monolithic resistors and MOS devices, using conventional IC fabrication technology. Consequently, the cost of manufacturing the IC is not significantly increased.

In accordance with an illustrative embodiment of the invention, a method of forming an oxide region in a semiconductor device includes the steps of forming a plurality of trenches in a semiconductor layer of the device, the trenches being formed in close relative proximity to one another, and oxidizing the semiconductor layer such that an insulating layer is formed on at least sidewalls and bottom walls of the trenches. The trenches are configured such that the insulating layer formed as a result of the oxidizing step substantially fills the trenches and substantially consumes the semiconductor layer between corresponding pairs of adjacent trenches. In this manner, a substantially continuous oxide region is formed throughout the plurality of trenches.

In accordance with another embodiment of the invention, a semiconductor structure includes a semiconductor layer and an oxide region formed in the semiconductor layer. The oxide region includes a plurality of trenches formed in the semiconductor layer in close relative proximity to one another that are oxidized such that an insulating layer is formed on at least sidewalls and bottom walls of the trenches. The trenches are configured such that the insulating layer substantially fills the trenches and substantially consumes the semiconductor layer between corresponding pairs of adjacent trenches, whereby a substantially continuous oxide region is formed throughout the plurality of trenches.

In accordance with yet another embodiment of the invention, two or more of the trenches are formed having different depths relative to one another so as to control a contour of a bottom surface of the thick oxide region as desired.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative IC fabrication methodologies suitable for forming a thick oxide region in an MOS device, as well as devices and/or other circuit structures. It should be appreciated, however, that the present invention is not limited to the particular configurations of the thick oxide region shown, or to any particular device and/or circuit structure. Rather, the invention is more generally applicable to novel techniques for forming an oxide region in a semiconductor device which advantageously improve electrical performance, reliability and/or high-frequency performance of the device without significantly increasing the cost of the device.

Although implementations of the present invention are described herein with specific reference to an MOS device and a complementary metal-oxide-semiconductor (CMOS) fabrication process, it is to be appreciated that the techniques of the present invention are similarly applicable to other fabrication processes (e.g., bipolar) and/or the formation of other devices, such as, but not limited to, a bipolar junction transistor (BJT), a vertical diffused MOS (DMOS) device, an extended drain MOS field-effect transistor (MOSFET) device, etc., with or without modifications thereto, as will be understood by those skilled in the art. Furthermore, although the invention will be described herein in the context of a P-channel MOS device, it is well understood by those skilled in the art that an N-channel MOS device could be formed by simply substituting opposite polarities to those given for the P-channel embodiment, and that the techniques and advantages of the present invention will similarly apply to the alternative embodiment.

It is to be understood that the various layers and/or regions shown in the accompanying figures may not be drawn to scale, and that one or more semiconductor layers and/or regions of a type commonly used in such integrated circuit structures may not be explicitly shown in a given figure for ease of explanation. This does not imply that the semiconductor layer(s) and/or region(s) not explicitly shown are omitted in the actual integrated circuit structure.

Figure 1:
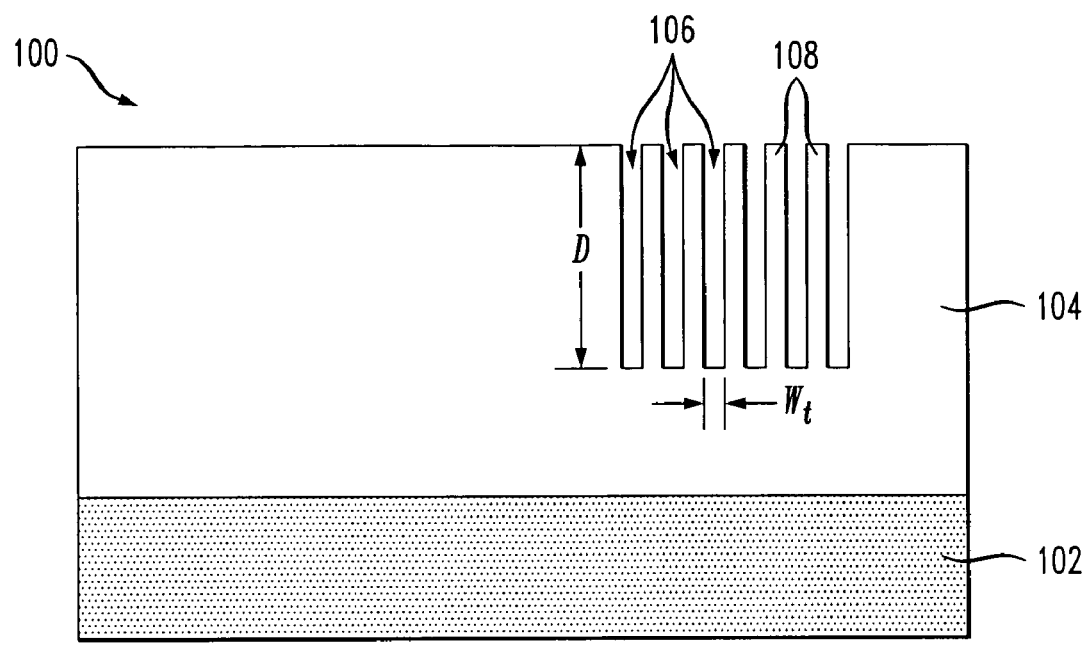
FIGS. 1–3 are cross-sectional views depicting steps in an illustrative methodology in which the techniques of the present invention are implemented.

FIG. 1 is a cross-sectional view depicting at least a portion of a semiconductor wafer 100 in which the techniques of the present invention are implemented. The wafer 100 preferably includes a substrate 102 which is commonly formed of single-crystal silicon (Si), although alternative materials may be used, such as, but not limited to, germanium, gallium arsenide, etc. The substrate 102 may have been modified by adding an impurity or dopant, such as by a diffusion or implant step, to change the conductivity of the material (e.g., N-type or P-type). An epitaxial layer 104 may be optionally formed on the substrate 102, such as, for example, by using a standard epitaxy process. The doping concentration of the epitaxial layer 104, if employed, is preferably lower (e.g., about $10^{15}$ to about $10^{16}$ atoms per cubic centimeter) in comparison to the doping concentration of the substrate 102, which is typically about $10^{18}$ to about $10^{19}$ atoms per cubic centimeter.

The term "semiconductor layer" as may be used herein refers to any semiconductor material upon which and/or in which other materials may be formed. The semiconductor layer may comprise a single layer, such as, for example, the substrate 102 or the epitaxial layer 104. Alternatively, the semiconductor layer may comprise multiple layers of different materials and/or layers of the same material having different doping concentrations, such as, for example, the substrate 102 and the epitaxial layer 104. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

As previously stated, a recessed LOCOS or trench isolation process can be used to form a thick oxide region in a semiconductor wafer. However, aside from being expensive to fabricate using these conventional methodologies, a practical depth of the thick oxide region is generally limited to about 2 μm or less due, at least in part, to the introduction of undesirable defects into the semiconductor device. The techniques of the present invention provide a simple and cost-effective solution which essentially eliminates the oxide depth limitation inherent in conventional methodologies, thereby allowing substantially thicker oxide regions to be formed in a semiconductor device, without significantly impacting device reliability and/or performance.

In accordance with an illustrative embodiment of the invention, an exemplary methodology for forming a thick oxide region in a semiconductor layer (e.g., epitaxial layer 104) of the wafer 100 includes first forming a plurality of trenches 106 in the epitaxial layer 104. The trenches 106 are preferably formed locally in the epitaxial layer 104, in close relative proximity to and substantially parallel with one another. The regions of the epitaxial layer 104 between corresponding pairs of adjacent trenches 106 may be referred to herein as mesas 108. Each of the trenches 106 may be formed having a cross-sectional depth D in the epitaxial layer 104. The depth D of the trenches 106 is preferably substantially equal to a desired cross-sectional thickness of the thick oxide region to be fabricated. Although the trenches 106 are depicted as each having the same depth relative to one another, the invention similarly contemplates that the trenches may be formed having varying depths in the epitaxial layer 104, as will be described below in conjunction with another exemplary embodiment illustrated in FIGS. 4 and 5. The trenches 106 may be formed, for example, by using a reactive ion etching (RIE) process, as will be known by those skilled in the art, although alternative means for forming the trenches are contemplated (e.g., wet etching, etc.).

Figure 2:
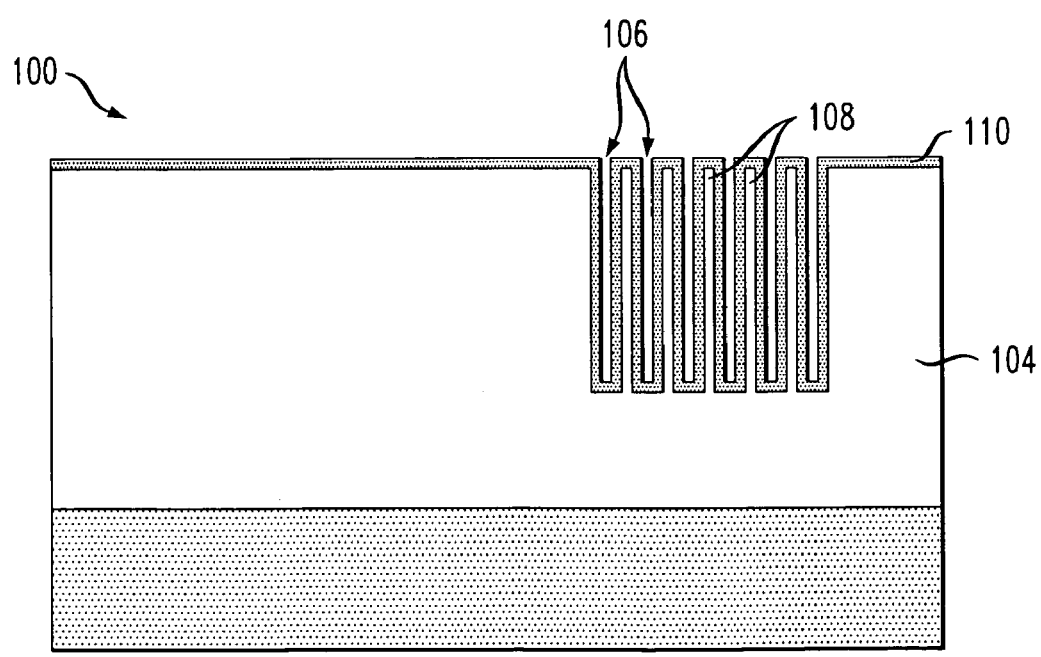

After forming the trenches 106, the wafer 100 is oxidized. As shown in FIG. 2, when the wafer 100 is exposed to an oxidizing atmosphere and is heated to a high temperature (e.g., about 900 to about 1200 degrees Celsius), silicon in the epitaxial layer 104 (or, alternatively, silicon in the substrate 102, if an epitaxial layer is not present) combines with oxygen to form an insulating layer 110, comprised primarily of silicon dioxide ($SiO_2$), on substantially all exposed surfaces of the wafer. The exposed wafer surfaces may include an upper surface of the epitaxial layer 104, and sidewalls and bottom walls of the trenches 106. The wafer 100 may, alternatively, be exposed to an environment containing nitrogen, in which case the insulating layer 414 may be comprised primarily of silicon nitride ($Si_3N_4$). The practical thickness of the thermally grown insulating layer 110 is generally in a range of about 500 to about 20,000 angstroms (or about 0.5 μm to about 2 μm). The lower limit of thickness is often dictated, at least in part, by electrical breakdown or random defect densities (e.g., pin holes) in the insulating layer 110. The upper limit of thickness is typically dictated, at least in part, by required oxidation times and the difficulty of etching the insulating layer 110 during subsequent photolithography steps.

During the oxidizing process, at least a portion of the silicon in the epitaxial layer 104 is essentially consumed. Since the silicon dioxide forming the insulating layer 110 has approximately twice the volume of silicon, a portion (e.g., about 46 percent) of the total cross-sectional thickness of the insulating layer will recede below the surface of the epitaxial layer 104, while the remaining portion (e.g., about 54 percent) of the insulating layer will be grown on top of the surface of the epitaxial layer. Thus, as a result of the oxidizing process, the width of the trenches 106 in the epitaxial layer 104, as well as the width of the mesas 108, will effectively be reduced.

Figure 3:
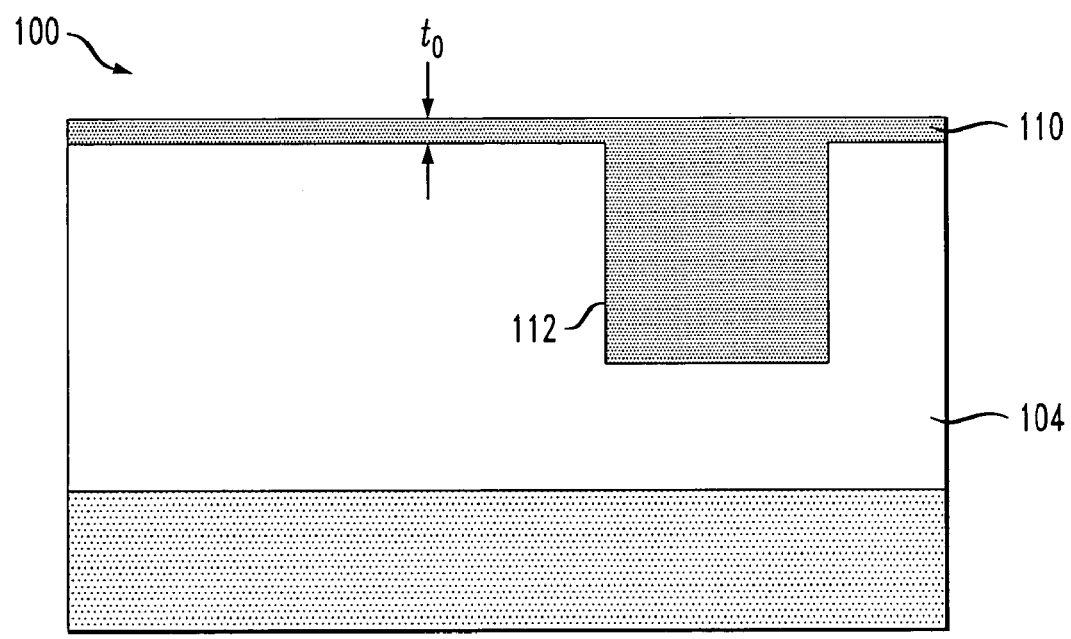

When a width of the trenches 106 is configured to be sufficiently narrow, such as, for example, about 1 μm (e.g., substantially equal to the cross-sectional thickness of the insulating layer 110), the insulating layer formed on the sidewalls and bottom walls of the trenches will eventually merge together, thereby substantially filling the trenches with silicon dioxide. Likewise, when a width of the mesas 108, as determined by a spacing between corresponding pairs of adjacent trenches 106, is made sufficiently narrow (e.g., about 1 μm), substantially all of the epitaxial material in the mesas will eventually be consumed by the silicon dioxide in the insulating layer 110. In this manner, the trenches 106 and mesas 108 will effectively cease to exist, and in place thereof a substantially continuous thick oxide region 112 will be formed in the epitaxial layer 104 of the wafer 100, as shown in FIG. 3. A cross-sectional thickness of the thick oxide region 112 will be substantially equal to the depth D of the trenches 106, as previously stated.

It is to be appreciated that the widths of the plurality of trenches 106 need not be the same relative to one another. However, the trenches 106 should be configured such that:

$$W_t \leq 2 \cdot t_o \cdot (\% \text{ oxide above Si surface}),$$

where $W_t$ is the width of a given one of the trenches 106 (see, e.g., FIG. 1) and $t_o$ is a cross-sectional thickness of the insulating layer 110. By way of example only and without loss of generality, for an insulating layer thickness $t_o$ of 1 μm, and assuming about 54 percent (0.54) of the oxide forming the insulating layer 110 is grown on the surface of the epitaxial layer 104, a maximum width $W_t$ of any one of the trenches 106 will be about 2×1 μm×0.54, or about 1.08 μm. If a trench width of greater than this amount is used for a given trench 106, the thickness $t_o$ of the insulating layer 110 should be increased accordingly, or else the insulating layer formed on the sidewalls and bottom wall of the trench will not completely merge together to fill the trench, thereby allowing an opening to remain in a center of the trench.

Likewise, it is to be appreciated that the widths of the mesas 108, which are determined by a spacing between corresponding pairs of adjacent trenches 106, need not be the same relative to one another. However, a spacing of the trenches 106 should be configured such that:

$$W_m \leq 2 \cdot t_o \cdot (\% \text{ oxide below Si surface}),$$

where $W_m$ is the width of a given mesa 108 (see, e.g., FIG. 1) and $t_o$ is the total thickness of the insulating layer 110. By way of example only and without loss of generality, for an insulating layer thickness $t_o$ of 1 μm, and assuming about 46 percent (0.46) of the oxide forming the insulating layer 110 recedes below the surface of the epitaxial layer 104, a maximum width $W_m$ of any one of the mesas 108 is about 2×1 μm×0.46, or about 0.92 μm. If a mesa width of greater than this amount is used, the thickness $t_o$ of the insulating layer 110 should be increased accordingly, or else the insulating layer will not fully consume the silicon in the mesas 108. This could result in a thick oxide region 112 being formed having narrow vertical fingers of silicon disposed therein.

A width of the thick oxide region 112 can be selectively varied as a function of the widths of the trenches 106 and mesas 108, at least up to a certain point. As previously explained, the maximum widths of the trenches 106 and mesas 108 is limited primarily by the maximum practical thickness to which the insulating layer 110 can be formed. However, in accordance with the techniques of the present invention, the width of the thick oxide region 112 can be advantageously varied as a function of the number of trenches 106 formed in the epitaxial layer 104. Thus, as the number of trenches 106 is increased, the width of the resulting thick oxide region 112 will also increase. Furthermore, there is essentially no limit to the cross-sectional thickness of the thick oxide region 112, since the thickness of the thick oxide region is determined primarily as a function of the depth of the trenches 106, rather than as a function of the thickness to which an oxide layer may be thermally grown or deposited. Thus, using the techniques of the present invention, an oxide region having a cross-sectional thickness of greater than about 10 μm can be beneficially formed, which is not practically achievable using conventional methodologies.

Figure 4:
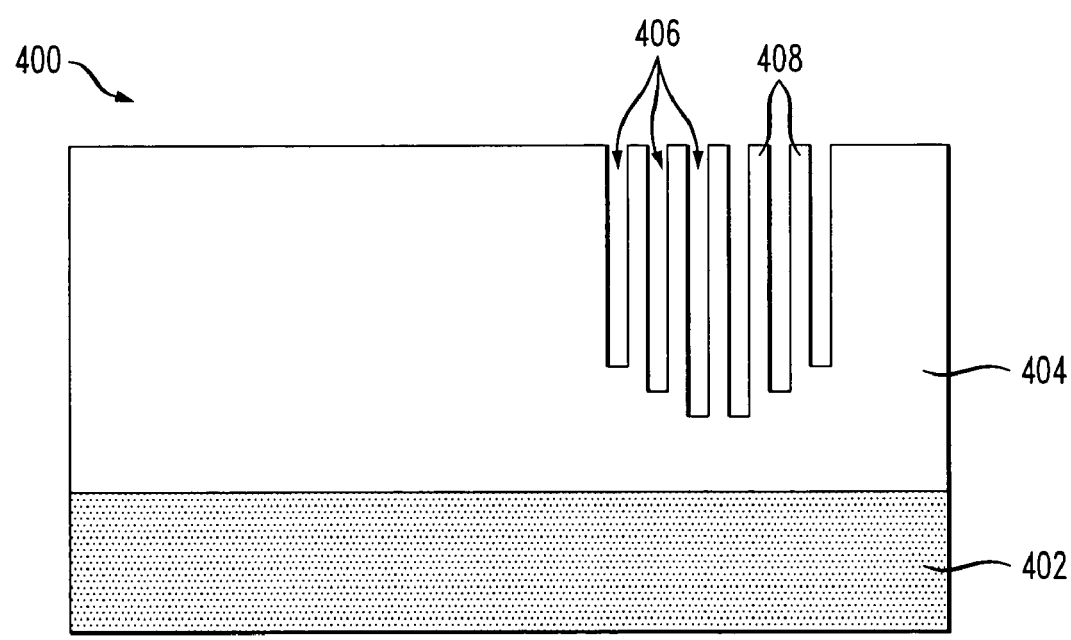
FIGS. 4 and 5 are cross-sectional views depicting steps in an illustrative methodology according to another embodiment of the present invention.

FIG. 4 is a cross-sectional view illustrating at least a portion of a semiconductor wafer 400 in which the techniques of the present invention are implemented. The wafer 400 includes a substrate 402 preferably formed of single-crystal silicon, although alternative materials may also be used (e.g., germanium, etc.). An epitaxial layer 404 may be formed on the substrate 402, such as by using a standard epitaxy process.

In accordance with another embodiment of the invention, an exemplary methodology for forming a thick oxide region in a semiconductor layer of the wafer 400 includes first forming a plurality of trenches 406 in the epitaxial layer 404. The trenches 406 may be formed, for example, by using a reactive ion etching process, although alternative means for forming the trenches are similarly contemplated (e.g., wet etching, etc.), as will be known by those skilled in the art. The trenches 406 are preferably formed locally in the epitaxial layer 404, in close relative proximity to and substantially parallel with one another. The regions of the epitaxial layer 404 between corresponding pairs of adjacent trenches 406 may be referred to herein as mesas 408. In contrast to the exemplary semiconductor structure depicted in FIG. 1, which comprises a plurality of trenches of substantially equal depth relative to one another, the trenches 406 in the exemplary semiconductor structure of FIG. 4 are formed having varying depths relative to one another. The depths of the trenches 406 may be configured so as to advantageously control a shape of at least a bottom wall of the thick oxide region as desired.

Figure 5:
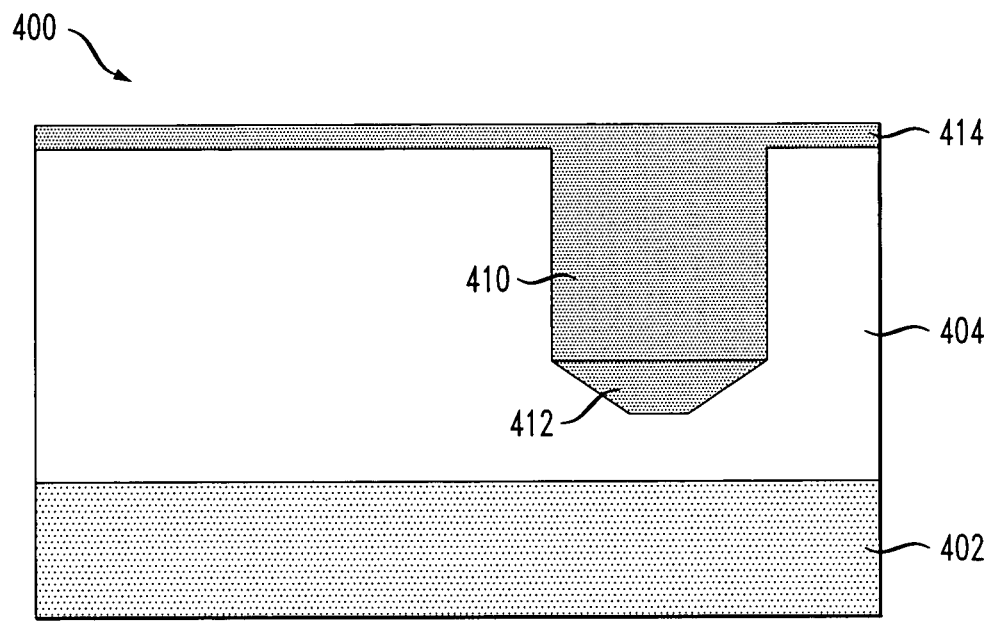

After forming the trenches 406, the wafer 400 is preferably oxidized. The oxidation process may be performed in a manner similar to that described above in conjunction with FIGS. 2 and 3. Specifically, as shown in FIG. 5, when the wafer 400 is exposed to an oxidizing environment (e.g., oxygen) and a substantially high temperature (e.g., about 900 to about 1200 degrees Celsius), silicon in the epitaxial layer 404 (or, alternatively, silicon in the substrate 402, if an epitaxial layer is not present) forms an insulating layer 414 comprised primarily of silicon dioxide ($SiO_2$), on substantially all exposed surfaces of the wafer. The wafer 400 may, alternatively, be exposed to an environment containing oxygen and an additional element, in which case certain properties of the insulating layer 414 (e.g., dielectric constant, etc.) may be enhanced and/or modified by the additional element. As previously explained in conjunction with the exemplary semiconductor structure shown in FIGS. 1–3, a width of the trenches 406 is configured to be sufficiently narrow (e.g., about 1 µm), such that the insulating layer 414 formed on sidewalls and bottom walls of the trenches will ultimately merge together, thereby substantially filling the trenches with silicon dioxide. Likewise, a width of the mesas 408, as determined by a spacing between corresponding pairs of adjacent trenches 406, is made sufficiently narrow, such that substantially all of the epitaxial material in the mesas is consumed by the silicon dioxide forming the insulating layer 414. In this manner, a substantially continuous thick oxide region 410 is preferably formed in the epitaxial layer 404 of the wafer 400.

Since the trenches 406 in this illustrative embodiment are not all formed having the same depth, a bottom wall 412 of the thick oxide region 410 will not be flat, as in the embodiment shown in FIG. 3, but will instead exhibit a contour which substantially follows the corresponding depths of the trenches 406, as shown. It is to be understood that the present invention is not limited to the particular shape and/or dimensions of the thick oxide region shown.

Figure 6:
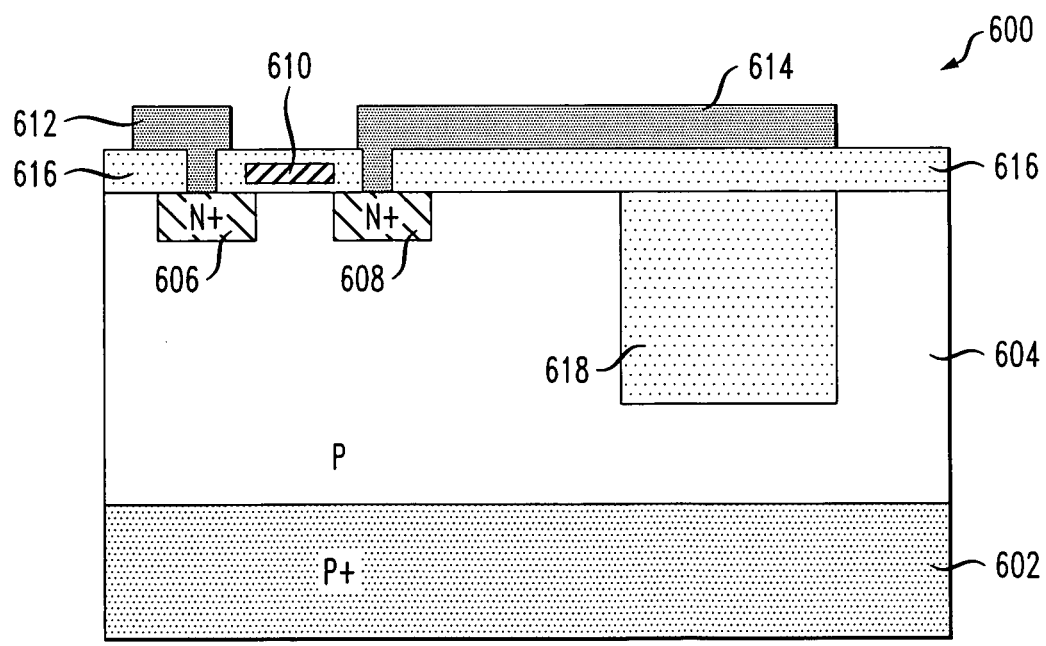
FIG. 6 is a cross-sectional view depicting at least a portion of an exemplary MOS device, formed in accordance with the present invention.

FIG. 6 illustrates a cross-sectional view of at least a portion of a semiconductor wafer in which the techniques of the present invention are implemented. The wafer includes an exemplary MOS device 600 formed on a semiconductor substrate 602. The substrate 602 is preferably formed of single-crystal silicon, although alternative materials (e.g., germanium, etc.) may be used. Additionally, the substrate 602 may have been modified by adding an impurity or dopant (e.g., boron, phosphorus, arsenic, etc.), such as by a diffusion or implant step, to change the conductivity of the material as desired. In a preferred embodiment of the invention, the substrate 602 is of P-type conductivity that is heavily doped (e.g., about $5 \times 10^{18}$ to about $5 \times 10^{19}$ atoms per cubic centimeter), often represented with a "+" designation, and hence may be referred to as a P+ substrate. An epitaxial layer 604 may be formed on the substrate 602. The epitaxial layer 604 may also be modified by adding a P-type impurity (e.g., boron).

The exemplary MOS device 600 further includes a source region 606 and a drain region 608 formed in the epitaxial layer 604, proximate an upper surface of the epitaxial layer. The source and drain regions are preferably doped, such as by an implant process, with an impurity (e.g., boron, phosphorus, etc.) of a known concentration level to selectively change the conductivity of the material as desired. Preferably, the source and drain regions 606, 608 have a conductivity type associated therewith which is opposite a conductivity type of the substrate 602, so that active regions can be formed in the device. In a preferred embodiment of the invention, the source and drain regions 606,608 are of N-type conductivity. It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region.

A source contact 612 is formed in the MOS device 600 for providing an electrical connection to the source region 606. Likewise, a drain pad 614 is formed in the MOS device 600 for providing an electrical connection to the drain region 608. The MOS device 600 further includes a gate 610 formed proximate the upper surface of the epitaxial layer 604 and at least partially between the drain and source regions 606, 608. The gate 610 is preferably formed of an electrically conductive material, such as, for example, polysilicon material, although suitable alternative materials (e.g., metal, etc.) may be similarly employed. An insulating layer 616 formed on the upper surface of the wafer serves to electrically isolate the gate 610 from the source contact 612 and drain pad 614.

In order to improve high-frequency performance in the MOS device 600, it is desirable to reduce parasitic capacitance in the device. Since the MOS device is often arranged such that the source region 606 is tied to the substrate potential, which may be ground, the parasitic capacitance associated with the source region and/or electrical connections thereto do not significantly affect high-frequency performance of the MOS device. Therefore, attempts to reduce parasitic capacitance in the device often focus on the drain region and/or electrical connections thereto. A substantially large portion (e.g., about 30 to about 60 percent) of the parasitic drain capacitance in the MOS device can be attributed to a capacitance $C_{pad}$ associated with the drain pad 614. This is due, at least in part, to the large area typically consumed by the drain pad in proportion to other structures in the MOS device 600.

In accordance with an illustrative embodiment of the invention, a thick oxide region 618 is formed in the epitaxial layer 604 of the MOS device 600. At least a portion of the thick oxide region 614 is formed below the drain pad 614 and the substrate 602, so as to provide electrical isolation between the drain pad 614 and the substrate 602 in the MOS device 600. While it is known to provide a relatively shallow oxide region below the drain pad, the thickness of the oxide region has been limited thus far to a depth of about 2 µm or less, as previously explained. Using the techniques of the present invention previously described, a thick oxide region 618 having a cross-sectional thickness of about 10 µm or more can be formed, thereby providing a significant beneficial reduction in parasitic drain capacitance compared to conventional approaches.

The techniques of the present invention may be additionally used to form isolation regions in an IC device, as well as passive components in the IC, such as, but not limited to, monolithic resistors and inductors. The benefits of using the techniques of the invention are especially pronounced when forming monolithic inductors, which can be significantly degraded by the presence of a conductive material near the inductor. Forming a thick oxide region in accordance with the techniques of the invention under at least a portion of the inductor can advantageously improve the electrical characteristics and/or performance of the inductor. Likewise, for monolithic resistors comprised primarily of polysilicon material and of relatively high resistive value (e.g., greater than about 100 kilo ohms), the value of the resistor can be significantly effected by a voltage potential in the silicon. Thus, forming a thick oxide region in accordance with the methodologies of the present invention proximate the resistor can substantially reduce a voltage dependence of the resistor.

The novel semiconductor structure and/or MOS device of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor structure, comprising:
   a semiconductor layer; and
   an oxide region formed in the semiconductor layer, the oxide region comprising a plurality of trenches formed in the semiconductor layer in close relative proximity to one another that are oxidized such that an insulating layer is formed on at least sidewalls and bottom walls of the trenches, wherein the trenches are configured such that the insulating layer substantially fills the trenches and substantially consumes the semiconductor layer between corresponding pairs of adjacent trenches, whereby a substantially continuous oxide region is formed throughout the plurality of trenches;
   wherein the plurality of trenches includes two end trenches and two or more internal trenches between the end trenches, at least a subset of the internal trenches having different depths relative to one another.

2. The semiconductor structure of claim 1, wherein a cross-sectional depth of the oxide region is determined primarily as a function of the depths of the plurality of trenches in the semiconductor layer.

3. The semiconductor structure of claim 1, wherein a contour of a bottom surface of the oxide region is controlled at least in part as a function of the respective depths of the plurality of trenches in the semiconductor layer.

4. The semiconductor structure of claim 1, wherein a cross-sectional width of the oxide region formed in the semiconductor layer is determined primarily as a function of a number of trenches formed in the semiconductor layer.

5. The semiconductor structure of claim 1, wherein the oxide region comprises a thick oxide region.

6. The semiconductor structure of claim 1, wherein a cross-sectional depth of the oxide region is greater than about two micrometers.

7. The semiconductor structure of claim 1, wherein the depths of the internal trenches are greater than a depth of each of the end trenches.

8. The semiconductor structure of claim 1, wherein a contour of a bottom surface of the oxide region is at least partially sloped, a shape of the slope being controlled at least in part as a function of the respective depths of the plurality of trenches in the semiconductor layer.

9. A semiconductor structure, comprising:
   a semiconductor layer; and
   an oxide region formed in the semiconductor layer, at least a portion of the oxide region being formed by creating a plurality of trenches in the semiconductor layer, the trenches being formed in close relative proximity to one another, and oxidizing the semiconductor layer so that an insulating layer is formed on at least sidewalls and bottom walls of the trenches, wherein the trenches are configured such that the insulating layer substantially fills the trenches and substantially consumes the semiconductor layer between corresponding pairs of adjacent trenches, whereby a substantially continuous oxide region is formed throughout the plurality of trenches;
   wherein the plurality of trenches includes two end trenches and two or more internal trenches between the end trenches, at least a subset of the internal trenches having different depths relative to one another.

10. An integrated circuit including at least one semiconductor structure, the at least one semiconductor structure comprising:
    a semiconductor layer; and
    an oxide region formed in the semiconductor layer, the oxide region comprising a plurality of trenches formed in the semiconductor layer in close relative proximity to one another that are oxidized such that an insulating layer is formed on at least sidewalls and bottom walls of the trenches, wherein the trenches are configured such that the insulating layer substantially fills the trenches and substantially consumes the semiconductor layer between corresponding pairs of adjacent trenches, whereby a substantially continuous oxide region is formed throughout the plurality of trenches;
    wherein the plurality of trenches includes two end trenches and two or more internal trenches between the end trenches, at least a subset of the internal trenches having different depths relative to one another.

11. A metal-oxide-semiconductor device, comprising:
    a semiconductor layer of a first conductivity type;
    first and second source/drain regions of a second conductivity type formed in the semiconductor layer proximate an upper surface of the semiconductor layer and spaced apart relative to one another;
    an insulating layer formed on at least a portion of the upper surface of the semiconductor layer proximate the first and second source/drain regions;
    a gate formed on the insulating layer and at least partially between the first and second source/drain regions;
    a conductive pad formed on at least a portion of the insulating layer for providing electrical connection to one of the first and second source/drain regions; and
    an oxide region formed under at least a portion of the conductive pad, the oxide region comprising a plurality of trenches formed in the semiconductor layer in close relative proximity to one another that are oxidized such that an oxide layer is formed on at least sidewalls and bottom walls of the trenches, wherein the trenches are configured such that the oxide layer substantially fills the trenches and substantially consumes the semiconductor layer between corresponding pairs of adjacent trenches, whereby a substantially continuous oxide region is formed throughout the plurality of trenches.

* * * * *